United States Patent
Miyanaga et al.

(10) Patent No.: US 9,903,908 B2
(45) Date of Patent: Feb. 27, 2018

(54) NONLINEAR DISTORTION DETECTION DEVICE AND DISTORTION COMPENSATION POWER AMPLIFIER

(71) Applicant: Panasonic Corporation, Osaka (JP)

(72) Inventors: Kenji Miyanaga, Kanagawa (JP); Noriaki Saito, Tokyo (JP)

(73) Assignee: PANASONIC CORPORATION, Osaka (JP)

( * ) Notice: Subject to any disclaimer, the term of this patent is extended or adjusted under 35 U.S.C. 154(b) by 58 days.

(21) Appl. No.: 14/623,239

(22) Filed: Feb. 16, 2015

(65) Prior Publication Data
US 2015/0241494 A1 Aug. 27, 2015

(30) Foreign Application Priority Data

Feb. 24, 2014 (JP) ................................. 2014-033041

(51) Int. Cl.
*G01R 31/28* (2006.01)
*H03F 1/32* (2006.01)

(52) U.S. Cl.
CPC ....... *G01R 31/2837* (2013.01); *H03F 1/3247* (2013.01); *H03F 1/3294* (2013.01); *G01R 31/2841* (2013.01)

(58) Field of Classification Search
CPC . H03F 1/3247; H03F 1/3294; G01R 31/2837; G01R 31/2841
USPC .......................................................... 324/613
See application file for complete search history.

(56) References Cited

U.S. PATENT DOCUMENTS

| 4,672,565 | A | * | 6/1987 | Kuno | ..................... G01C 17/30 |
|---|---|---|---|---|---|
| | | | | | 33/356 |
| 5,266,906 | A | | 11/1993 | Inahashi | |
| 5,339,054 | A | * | 8/1994 | Taguchi | ................ H04L 27/368 |
| | | | | | 332/100 |
| 5,448,206 | A | * | 9/1995 | Newhall | ........... H04L 25/03343 |
| | | | | | 329/300 |
| 2008/0068080 | A1 | | 3/2008 | Miyatani et al. | |
| 2010/0295612 | A1 | | 11/2010 | Ohkawara et al. | |

FOREIGN PATENT DOCUMENTS

| JP | 5-121958 A | 5/1993 |
|---|---|---|
| JP | 2005-079935 | 3/2005 |
| JP | 2010-154459 | 7/2010 |
| JP | 2011-004387 | 1/2011 |
| JP | 2012-191297 A | 10/2012 |
| WO | 2006/082681 A1 | 8/2006 |

OTHER PUBLICATIONS

Physics Classroom, "Harmonics and Patterns", p. 1-3, Waves Lesson 4—Standing waves, 2017, http://www.physicsclassroom.com/class/waves/Lesson-4/Harmonics-and-Patterns.*

* cited by examiner

*Primary Examiner* — Patrick Assouad
*Assistant Examiner* — Khristopher Yodichkas
(74) *Attorney, Agent, or Firm* — Greenblum & Bernstein, P.L.C.

(57) ABSTRACT

A nonlinear distortion detection device that includes a test signal generator that generates a test signal and outputs the test signal to have the power amplifier amplify the test signal, a Fourier transformer that converts an output signal of the power amplifier to a signal in a frequency domain, and a distortion factor calculator that calculates a distortion factor of the power amplifier based on amplitude information and phase information of the signal in the frequency domain.

8 Claims, 15 Drawing Sheets

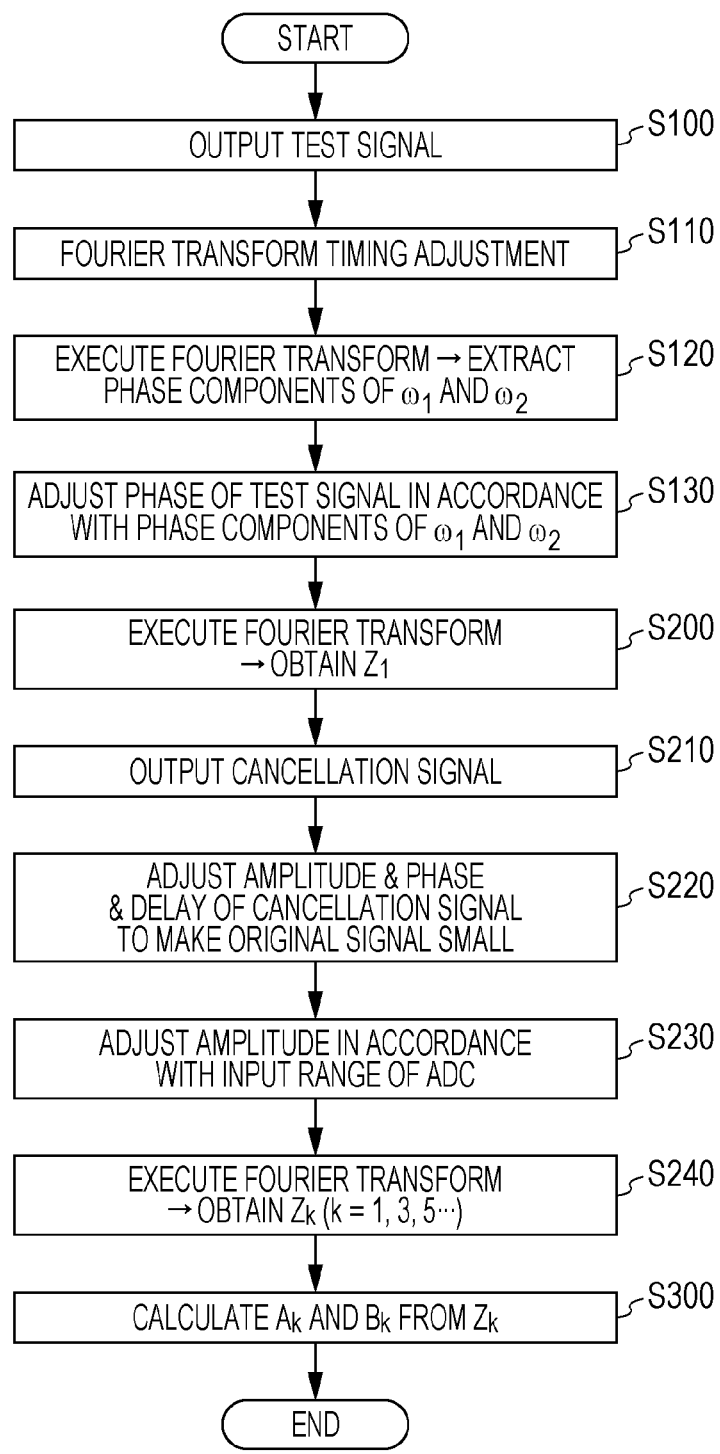

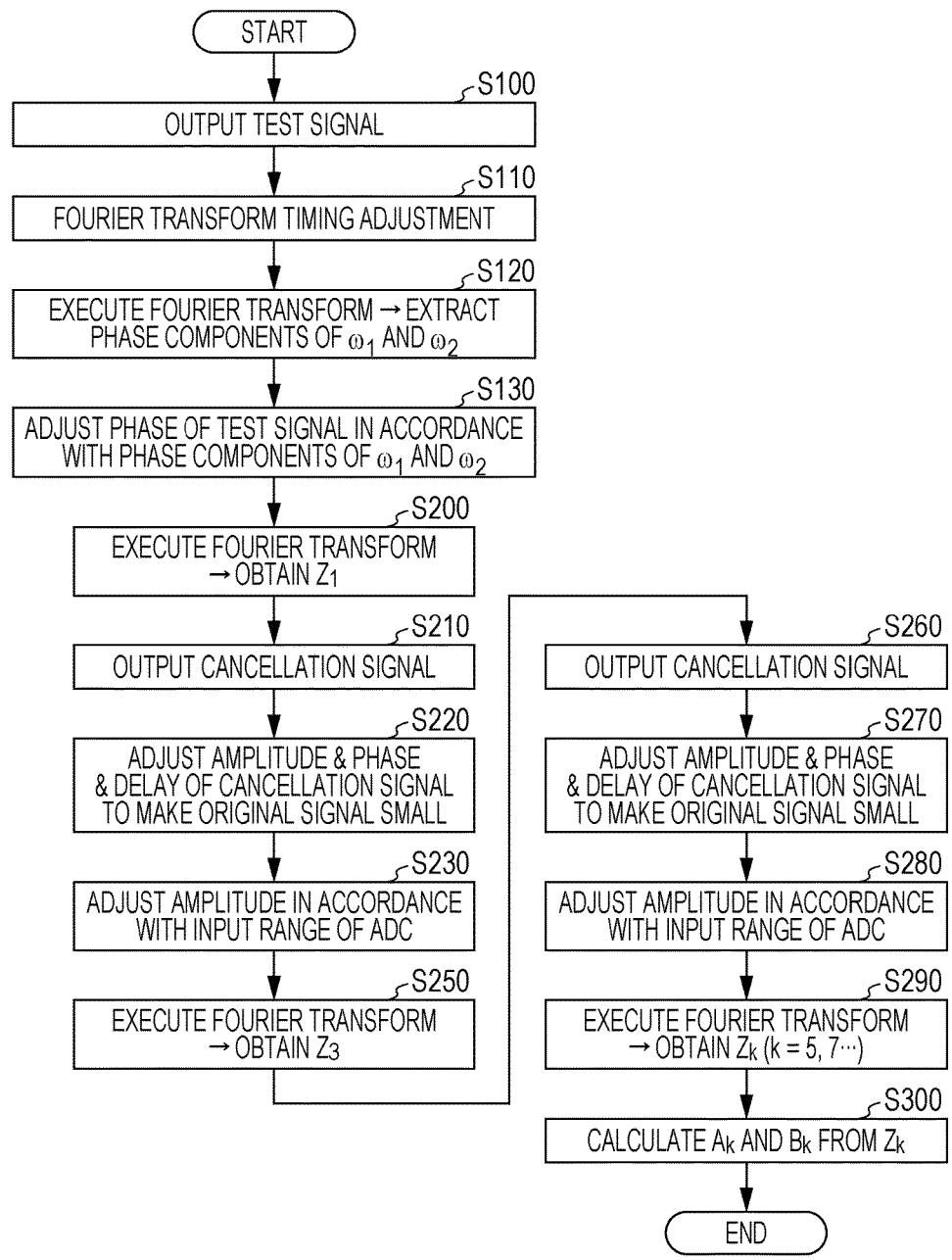

NONLINEAR DISTORTION DETECTION DEVICE AND DISTORTION COMPENSATION POWER AMPLIFIER

CROSS REFERENCES TO RELATED APPLICATIONS

This application claims priority to Japanese Patent Application No. 2014-033041, filed on Feb. 24, 2014, the contents of (each of) which are hereby incorporated by reference.

BACKGROUND

1. Technical Field

The present disclosure relates to a nonlinear distortion detection device that detects nonlinear distortion produced by a power amplifier used for a wireless communication device and the like and a distortion compensation power amplifier that is provided with the nonlinear distortion detection device.

2. Description of the Related Art

In recent years, mobile equipment equipped with a wireless communication function, such as mobile telephones and laptop personal computers, have been increasingly spread. In the wireless communication devices equipped in such equipment, there is a demand for high linearity in order to suppress an increase in adjacent channel leakage power derived from nonlinear input/output properties of a power amplifier. However, since it is difficult to attain higher output and higher efficiency while keeping high linearity, it becomes important to apply a nonlinear distortion compensation technique.

As an approach to compensate nonlinear properties of power amplifiers, a predistortion approach has been attracting attention in recent years. A predistortion approach is a method in which properties opposite to the distortion properties produced by a power amplifier are given to an input signal in advance to be inputted to the power amplifier. As a distortion compensation power amplifier using the predistortion approach, there is one described in Japanese Unexamined Patent Application Publication No. 2005-079935, for example.

SUMMARY

However, in the distortion compensation power amplifier described in Japanese Unexamined Patent Application Publication No. 2005-079935, an amount of operations to obtain a distortion factor representing nonlinear properties of the power amplifier is large, so that there is a problem of causing a larger circuit size or a longer operation time.

Thus, one non-limiting and exemplary embodiment provides a nonlinear distortion detection device and a distortion compensation power amplifier that are capable of simplifying operations to obtain a distortion factor representing nonlinear properties of a power amplifier.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a nonlinear distortion detection device of the present disclosure is a nonlinear distortion detection device that includes a test signal generator that generates a test signal and outputs the test signal to have the power amplifier amplify the test signal, a Fourier transformer that converts the amplified signal to a signal in a frequency domain, and a distortion factor calculator that calculates a distortion factor of the power amplifier based on amplitude information and phase information of the signal in the frequency domain.

According to the present disclosure, it is possible to simplify operations to obtain a distortion factor representing nonlinear properties of a power amplifier.

These general and specific aspects may be implemented using a system, a method, and a computer program, and any combination of systems, methods, and computer programs.

BRIEF DESCRIPTION OF THE DRAWINGS

FIG. 12 is a diagram illustrating a flow chart that describes a process to obtain a distortion factor $A_k$ in the distortion compensation power amplifier according to Sixth Embodiment;

FIG. 15 is a diagram illustrating a flow chart that describes a process to obtain a distortion factor $A_k$ in a modification of the distortion compensation power amplifier according to Sixth Embodiment.

DETAILED DESCRIPTION

Descriptions are given below to embodiments of the present disclosure with reference to the drawings.
(Underlying Knowledge Forming Basis of One Embodiment of the Present Disclosure)

Figure 1:
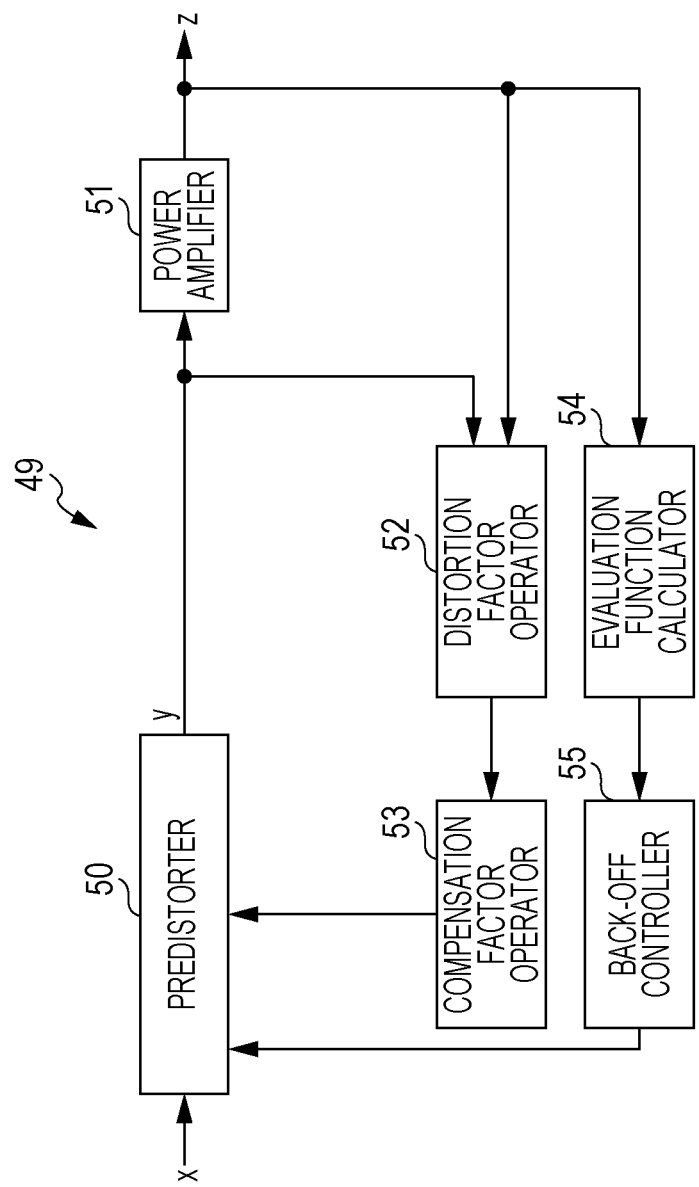
FIG. 1 is a block diagram illustrating a schematic configuration of a distortion compensation power amplifier in the predistortion approach described in Japanese Unexamined Patent Application Publication No. 2005-079935.

FIG. 1 is a block diagram illustrating a schematic configuration of a distortion compensation power amplifier in the predistortion approach described in Japanese Unexamined Patent Application Publication No. 2005-079935. A distortion compensation power amplifier 49 illustrated in FIG. 1 is configured with a predistorter 50, a power amplifier 51, a distortion factor calculator 52, a compensation factor calculator 53, an evaluation function calculator 54, and a back-off controller 55. After given distortion of properties opposite to nonlinear distortion of the power amplifier 51, a signal (input signal) x inputted to the predistorter 50 is outputted as a signal (output signal) y. The output signal y from the predistorter 50 is inputted to the power amplifier 51 to be outputted as a signal (output signal) z after distortion compensation by canceling each other out with the nonlinear distortion properties of the power amplifier 51.

Here, relationship between the output signal z of the power amplifier 51 and the output signal y of the predistorter 50 is represented as Expression (1) using complex power series.

$$z = \sum_k A_k |y|^{k-1} y \ (k = 1, 3, 5, \ldots) \tag{1}$$

Here, $A_k$ is a factor that represents nonlinear distortion properties of the power amplifier 51 and hereinafter referred to as a distortion factor. Similarly, relationship between the input signal x and the output signal y of the predistorter 50 is also represented as Expression (2) using complex power series.

$$y = \sum_k B_k |x|^{k-1} x \ (k = 1, 3, 5, \ldots) \tag{2}$$

Here, $B_k$ is a factor that represents inverse distortion properties given in the predistorter 50 and hereinafter referred to as a compensation factor. When Expression (2) is substituted into Expression (1), relationship between input and output of the distortion compensation power amplifier 49 is represented as Expression (3).

$$z = \sum_k C_k |x|^{k-1} x \ (k = 1, 3, 5, \ldots) \tag{3}$$

Here, a factor $C_k$ is represented as Expression (4) using the factors $A_k$ and $B_k$.

$$C_1 = A_1 B_1 \tag{4}$$
$$C_3 = A_1 B_3 + A_3 |B_1|^2 B_1$$
$$C_5 = A_1 B_5 + (2|B_1|^2 B_3 + B_1^2 B_3^*) A_3 + |B_1|^4 B_1 A_5$$
$$\vdots$$

The distortion factor calculator 52 obtains the factor $A_k$ by solving a simultaneous equation represented as Expression (5).

$$\begin{bmatrix} z(1) \\ \vdots \\ z(L) \end{bmatrix} = D \begin{bmatrix} A_1 \\ \vdots \\ A_K \end{bmatrix} \tag{5}$$

Here, a matrix D is represented Expression (6).

$$D = \begin{bmatrix} y(1) & \cdots & |y(1)|^{K-1} y(1) \\ \vdots & \ddots & \vdots \\ y(L) & \cdots & |y(L)|^{K-1} y(L) \end{bmatrix} \tag{6}$$

Next, the compensation factor calculator 53 calculates $B_k$ based on Expression (7). Expression (7) is obtained by making $C_3, C_5, \ldots$ to be zero in Expression (4).

$$B_1 = B_1 \tag{7}$$
$$B_3 = -|B_1|^2 B_1 \frac{A_3}{A_1}$$
$$B_5 = -|B_1|^4 B_1 \frac{A_5}{A_1} - (2|B_1|^2 B_3 + B_1^2 B_3^*) \frac{A_3}{A_1}$$
$$\vdots$$

The evaluation function calculator 54 and the back-off controller 55 determine $B_1$ in such a manner that an adjacent channel leakage power ratio becomes not more than a predetermined threshold. The predistorter 50 carries out distortion compensation based on Expression (2) from $B_k$ (k=3, 5, . . . ) that is obtained in the compensation factor calculator 53 and $B_1$ that is obtained in the back-off controller 55 to output the output signal y to the power amplifier 51.

The technique described in Japanese Unexamined Patent Application Publication No. 2005-079935 has following problems. That is, in order to obtain the distortion factor $A_k$ of the power amplifier 51, the simultaneous equation in Expression (5) or an inverse matrix of the matrix D represented by Expression (6) has to be solved. When solving as a simultaneous equation, a method such as elimination is used. When solving as an inverse matrix, whether or not there is an inverse matrix has to be determined by calculating a determinant of the matrix D to calculate each component of the inverse matrix. When seeking for a greater distortion compensation effect, the dimension of the matrix D has to be increased and the amount of operations rapidly increases. As a result, the circuit size becomes larger or the operation time becomes longer.

In addition, when operating by incorporating the output signal z of the power amplifier 51 in Expression (5), the output signal z is converted to a digital signal using ADC, where a number of significant bits of ADC has to be secured sufficiently for accurate conversion including distortion components at lower signal levels compared with the dominant wave components. However, the increase in number of significant bits is directly linked to an increase in circuit size and power consumption, so that the number of significant bits is forced to be suppressed particularly when the sampling rate is very high speed. In other words, when it is not possible to sufficiently secure a number of bits of ADC, the distortion factor $A_k$ is not obtained accurately due to the influence of a quantization error.

Descriptions are given below to a nonlinear distortion detection device and a distortion compensation power amplifier that are capable of simplifying operations to obtain a distortion factor of a power amplifier and also obtaining a distortion factor accurately even when it is not possible to secure a number of bits of ADC sufficiently.

First Embodiment

Figure 2:
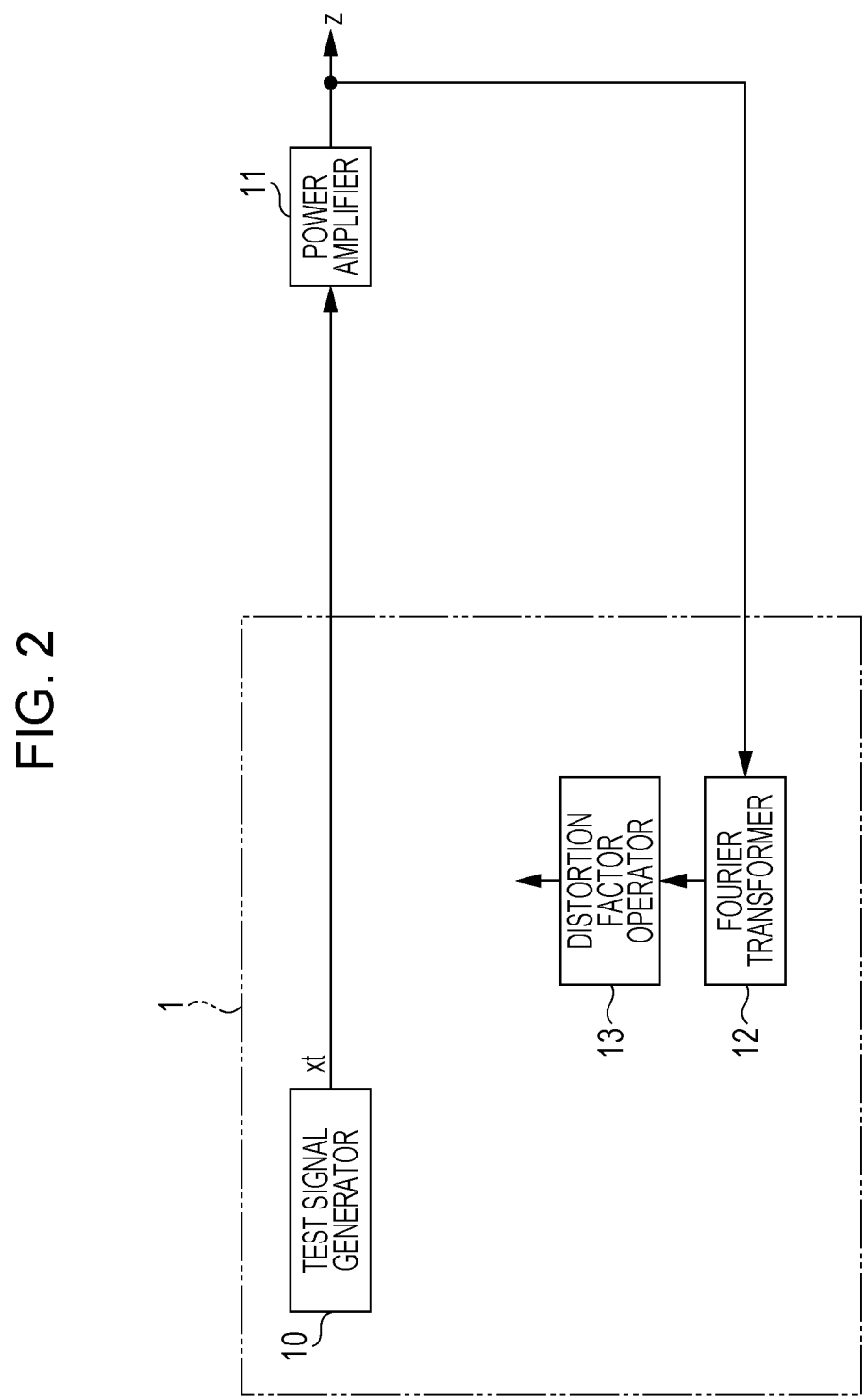
FIG. 2 is a block diagram illustrating a schematic configuration of a nonlinear distortion detection device according to First Embodiment.

FIG. 2 is a block diagram illustrating a schematic configuration of a nonlinear distortion detection device according to First Embodiment. In FIG. 2, a nonlinear distortion detection device 1 according to First Embodiment detects nonlinear distortion produced by a power amplifier 11 and is provided with a test signal generator 10, a Fourier transformer 12, and a distortion factor calculator 13. The test signal generator 10 generates a test signal xt to obtain a distortion factor $A_k$ for output to the power amplifier 11. The Fourier transformer 12 applies Fourier transform to an output signal z of the power amplifier 11 for conversion to a signal in the frequency domain. The distortion factor calculator 13 calculates the distortion factor $A_k$ of the power amplifier 11 based on amplitude information and phase information of the output signal obtained from the Fourier transformer 12. The power amplifier 11 outputs a signal z obtained by inputting the test signal xt generated by the test signal generator 10 for amplification (output signal).

The test signal generator 10 described above outputs two-tone signal illustrated in Expression (8) as the test signal xt.

$$xt = a(\cos \omega_1 t + \cos \omega_2 t) \quad (8)$$

Here, a is an amplitude of the test signal xt.

The output signal z of the power amplifier 11 is represented by Expression (9).

$$z = \sum_k A_k |xt|^{k-1} xt \, (k = 1, 3, 5, \ldots) \quad (9)$$

When Expression (8) is substituted into Expression (9), the output signal z is represented by Expression (10).

$$z = \left(aA_1 + \frac{9}{4}a^3 A_3 + \frac{25}{4}a^5 A_5 + \ldots\right)(\cos\omega_1 t + \cos\omega_2 t) + \quad (10)$$
$$\left(\frac{3}{4}a^3 A_3 + \frac{25}{8}a^5 A_5 + \ldots\right)\{\cos(2\omega_1 - \omega_2)t + \cos(2\omega_2 - \omega_1)t\} +$$
$$\left(\frac{5}{8}a^5 A_5 + \ldots\right)\{\cos(3\omega_1 - 2\omega_2)t + \cos(3\omega_2 - 2\omega_1)t\}$$
$$\vdots$$

From Expression (10), it is found that the output signal z includes, in addition to frequency components ($\omega_1$, $\omega_2$) included in the test signal xt, distortion components ($2\omega_1 - \omega_2$, $2\omega_2 - \omega_1$, $3\omega_1 - 2\omega_2$, $3\omega_2 - 2\omega_1$, ...) produced by nonlinearity of the power amplifier 11.

When a Fourier coefficient for Fourier transform of the output signal z of Expression (10) is $Z_k$, $Z_k$ is represented by Expression (11).

$$\begin{bmatrix} Z_1 \\ Z_3 \\ Z_5 \\ \vdots \end{bmatrix} = E \begin{bmatrix} A_1 \\ A_3 \\ A_5 \\ \vdots \end{bmatrix} \quad (11)$$

Here, $Z_1$ is a Fourier coefficient corresponding to the frequencies at $\omega_1$, $\omega_2$, $Z_3$ is a Fourier coefficient corresponding to the frequencies at $2\omega_1 - \omega_2$, $2\omega_2 - \omega_1$, and $Z_5$ is a Fourier coefficient corresponding to the frequencies at $3\omega_1 - 2\omega_2$, $3\omega_2 - 2\omega_1$. A matrix E is represented by Expression (12).

$$E = \begin{bmatrix} a & \frac{9}{4}a^3 & \frac{25}{4}a^5 \\ 0 & \frac{3}{4}a^3 & \frac{25}{8}a^5 & \ldots \\ 0 & 0 & \frac{5}{8}a^5 \\ & & \vdots & \end{bmatrix} \quad (12)$$

It is possible to obtain the distortion factor $A_k$ by solving Expression (11), and it is found that the matrix E is an upper triangular matrix from Expression (12). An upper triangular matrix is a square matrix having all components lower left from a diagonal component to be zero. When the dimension of the matrix is n, it is understood that a general inverse matrix operation requires an amount of calculation of $O(n^3)$ whereas an inverse matrix operation of an upper triangular matrix is done with an amount of calculation of $O(n^2)$. In other words, related techniques require a general operation of an inverse matrix as Expression (6) whereas the present disclosure is done with an operation of an inverse matrix of the upper triangular matrix as Expression (12) and thus it is possible to reduce the amount of calculation.

In such a manner, with the nonlinear distortion detection device 1 according to First Embodiment, a distortion factor representing nonlinear properties of a power amplifier is obtained by an inverse matrix operation of an upper triangular matrix using a signal after Fourier transform, so that it is possible to attain simplification of the operation to obtain the distortion factor $A_k$ compared with related techniques.

Second Embodiment

Next, descriptions are given to an embodiment when the nonlinear distortion detection device 1 in First Embodiment is applied to a distortion compensation power amplifier with reference to the drawings.

Figure 3:
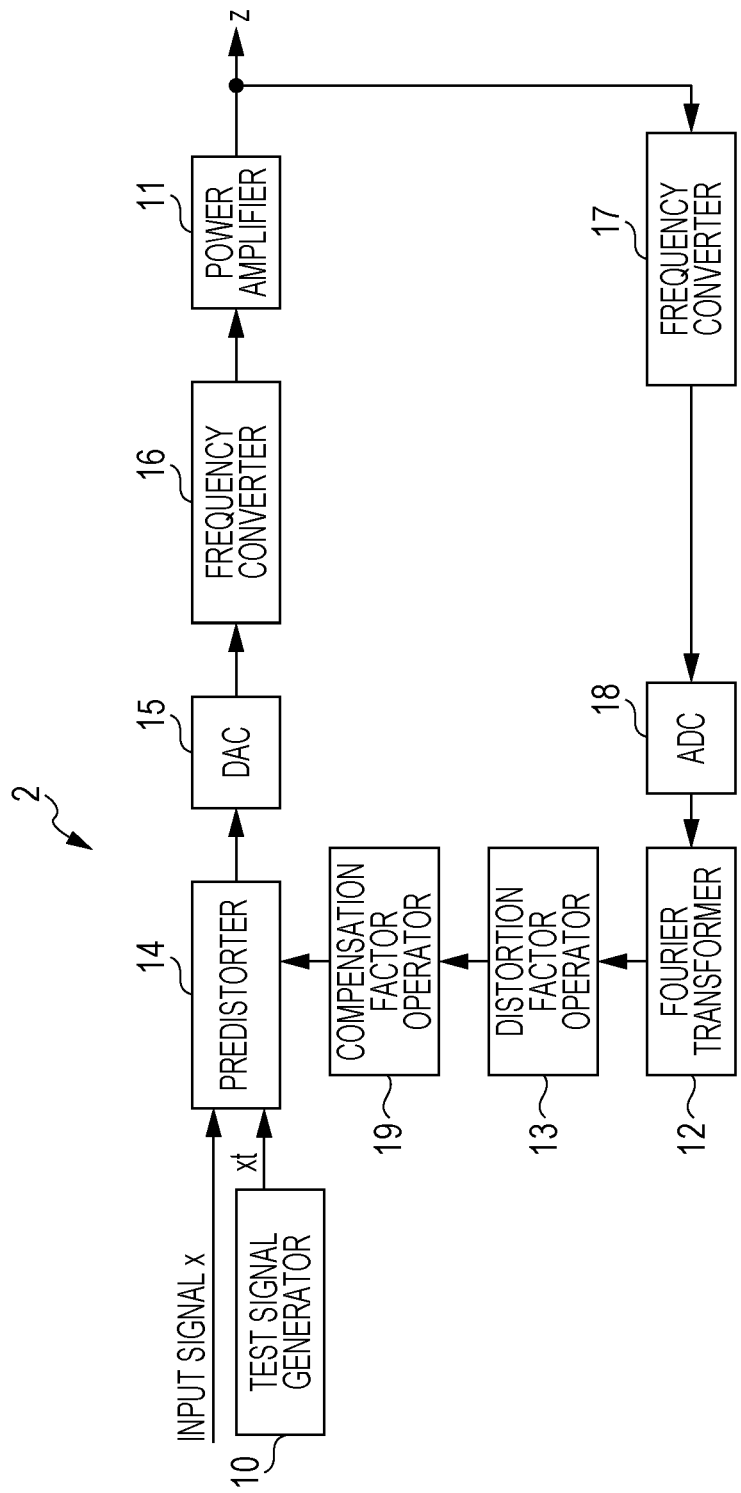
FIG. 3 is a block diagram illustrating a schematic configuration of a distortion compensation power amplifier according to Second Embodiment.

FIG. 3 is a block diagram illustrating a schematic configuration of a distortion compensation power amplifier according to Second Embodiment. In FIG. 3, identical reference characters are given to components in common with FIG. 2 described above. A distortion compensation power amplifier 2 illustrated in FIG. 3 is provided with a test signal generator 10, a predistorter 14, a digital-to-analog converter (DAC) 15, a frequency converter 16, a power amplifier 11, a frequency converter 17, an analog-to-digital converter (ADC) 18, a Fourier transformer 12, a distortion factor calculator 13, and a compensation factor calculator 19.

The test signal generator 10 generates a test signal xt to obtain a distortion factor $A_k$ for output to the predistorter 14. The predistorter 14 directly outputs the test signal xt to obtain the distortion factor $A_k$, and carries out distortion compensation to the input signal x in accordance with Expression (2) for output to the DAC 15 to communicate after obtaining the distortion factor $A_k$. The DAC 15 converts the signal outputted from the predistorter 14 to an analog signal. The frequency converter 16 upconverts the signal outputted from the DAC 15 from the baseband to a carrier frequency. For example, when the signal outputted from the DAC 15 is represented by complex signals of I and Q, the frequency converter 16 is configured as a quadrature modulator.

The power amplifier 11 amplifies the signal outputted from the frequency converter 16 to predetermined power. The input/output properties of the power amplifier 11 are represented by Expression (1). The frequency converter 17 downconverts the frequency of the signal z outputted from the power amplifier 11 from the carrier frequency to the baseband. For example, when the signal inputted to the ADC 18 is represented by complex signals of I and Q, the frequency converter 17 is configured as a quadrature demodulator. The ADC 18 incorporates the signal downconverted by the frequency converter 17 at a predetermined sampling frequency for conversion to a digital signal. The Fourier transformer 12 carries out Fourier transform to the signal outputted from the ADC 18 for conversion to a signal in the frequency domain. The distortion factor calculator 13 calculates a distortion factor $A_k$ of the power amplifier 11 using the signal outputted from the Fourier transformer 12. The compensation factor calculator 19 calculates a compensation factor $B_k$ from the distortion factor $A_k$ in accordance with Expression (7). The distortion factor calculator 13 calculates the distortion factor $A_k$ by solving Expression (11). Since the matrix E in Expression (11) is an upper triangular matrix as described above, it is possible to simplify the operations to obtain the distortion factor $A_k$ compared with distortion compensation power amplifiers in the past.

Figure 4:
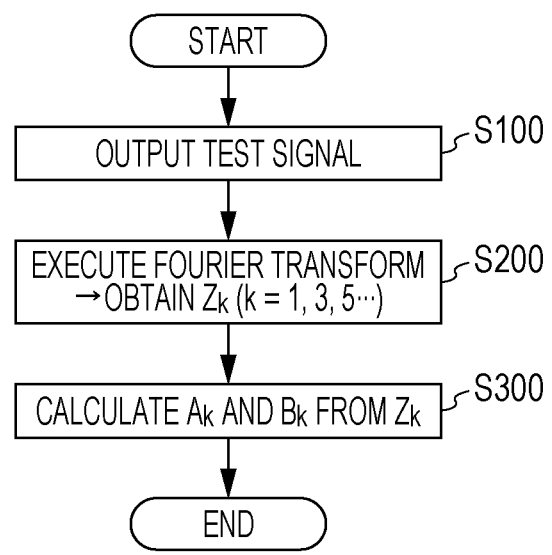
FIG. 4 is a diagram illustrating a flow chart that describes a process to obtain a distortion factor $A_k$ in the distortion compensation power amplifier according to Second Embodiment.

FIG. 4 is a flow chart that describes a process to obtain a distortion factor $A_k$ in the distortion compensation power amplifier 2 according to Second Embodiment. In FIG. 4, firstly the test signal generator 10 outputs a test signal xt (step S100). The test signal xt is inputted through the predistorter 14, the DAC 15, the frequency converter 16, the power amplifier 11, the frequency converter 17, and the ADC 18 to the Fourier transformer 12. At this time, the signal inputted to the Fourier transformer 12 includes, in addition to the original test signal xt, distortion components produced by nonlinearity of the power amplifier 11.

The Fourier transformer 12 carries out Fourier transform to convert the signal outputted from the ADC 18 to a signal in the frequency domain and obtains a Fourier coefficient corresponding to $Z_k$ in Expression (11) (step S200). After the Fourier transformer 12 obtains the Fourier coefficient corresponding to $Z_k$, the distortion factor calculator 13 solves Expression (11) to obtain the distortion factor $A_k$ from $Z_k$. Then, the compensation factor calculator 19 obtains a compensation factor $B_k$ from the distortion factor $A_k$ based on Expression (7) (step S300).

After obtaining the compensation factor $B_k$, the compensation factor calculator 19 outputs it to the predistorter 14. Then, the predistorter 14 gives distortion of inverse properties to the input signal based on the compensation factor $B_k$ for output to the power amplifier 11. Then, the distortion compensated signal is sent from the power amplifier 11.

In such a manner, with the distortion compensation power amplifier 2 according to Second Embodiment, the distortion factor representing nonlinear properties of a power amplifier is obtained by an inverse matrix operation of an upper triangular matrix using a signal after Fourier transform, so that it is possible to simplify operations of the distortion factor $A_k$ compared with related techniques. Then, it is possible to carry out distortion compensation the power amplifier using the compensation factor $B_k$ obtained from the distortion factor $A_k$.

Third Embodiment

Figure 5:
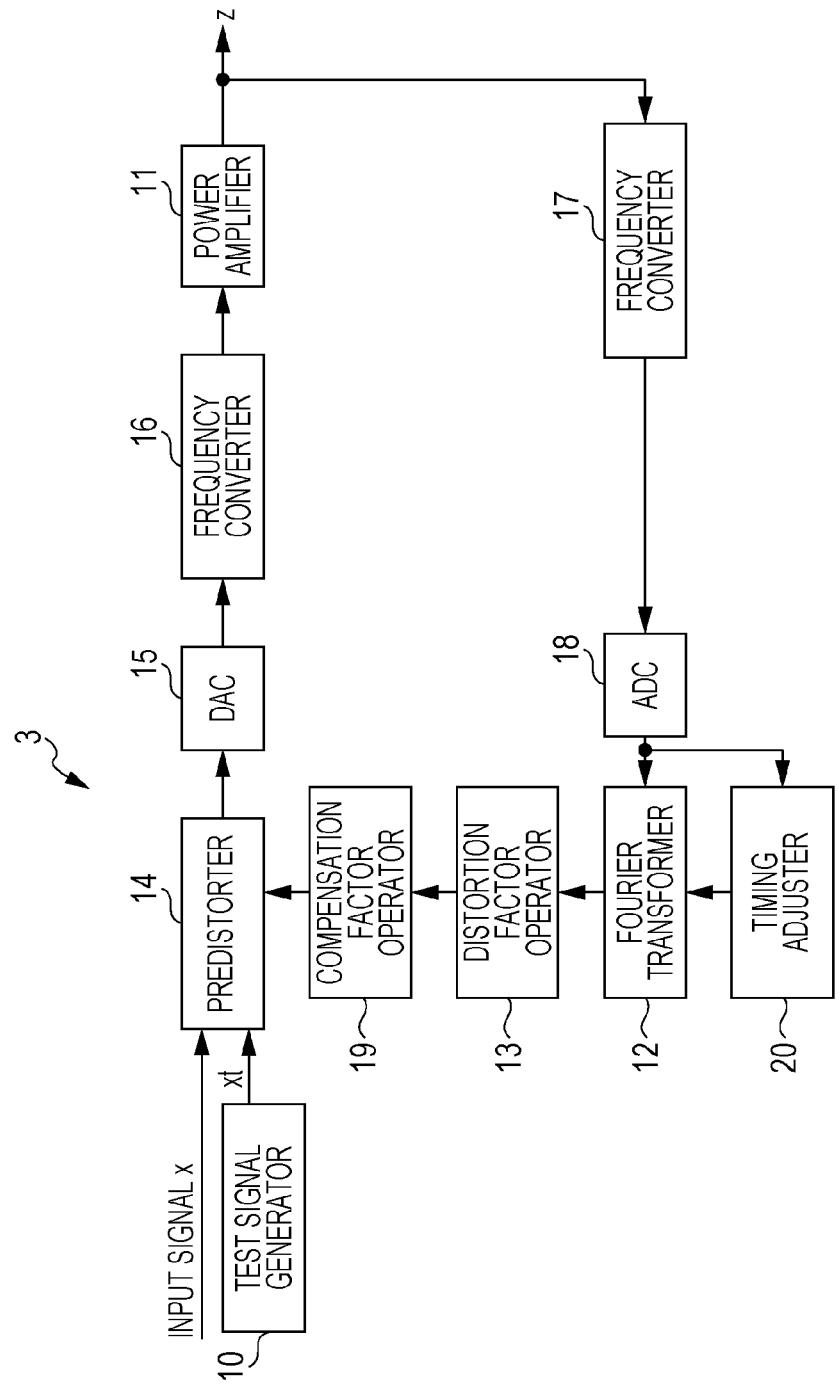
FIG. 5 is a block diagram illustrating a schematic configuration of a distortion compensation power amplifier according to Third Embodiment.

FIG. 5 is a block diagram illustrating a schematic configuration of a distortion compensation power amplifier according to Third Embodiment. In FIG. 5, identical reference characters are given to components in common with FIGS. 2 and 3 described above. A distortion compensation power amplifier 3 illustrated in FIG. 5 differs from the distortion compensation power amplifier 2 according to Second Embodiment illustrated in FIG. 3 in that a timing adjuster 20 is provided. In the distortion compensation power amplifier 2 according to Second Embodiment, a case is assumed where the time of inputting the test signal xt outputted from the test signal generator 10 through the power amplifier 11 to the Fourier transformer 12 is sufficiently short. In other words, a case is assumed where the signal inputted to the Fourier transformer 12 is represented by Expression (10). However, the signal inputted to the Fourier transformer 12 is sometimes actually delayed due to the response time of the circuit and the like and a timing offset in the timing to carry out Fourier transform may occur. When Fourier transform is applied while a timing offset occurs, phase rotation occurs in a Fourier coefficient $Z_k$ and it is not possible to correctly obtain the distortion factor $A_k$. With that, in the distortion compensation power amplifier 3 according to Third Embodiment, the timing to carry out Fourier transform in the Fourier transformer 12 is adjusted to appropriate timing by the timing adjuster 20.

Descriptions are given below to behaviors of the timing adjuster 20.

The timing adjuster 20 determines timing to carry out Fourier transform based on an amplitude value of the signal inputted to the Fourier transformer 12. Specifically, the timing of the maximum amplitude value of the signal is detected and the timing to carry out Fourier transform is determined based on that. The test signal xt is configured with two-tone signal and is a periodic function having a period determined by the frequencies of the two waves. The timing adjuster 20 detects the timing when the amplitude value of the signal becomes maximum by observing one or more periods of the period of the test signal xt.

Although the signal inputted to the Fourier transformer 12 through the power amplifier 11 is affected by nonlinear distortion of the power amplifier 11, the distortion components are at low levels compared with the components of the original test signal xt, so that the distortion components do not greatly affect behaviors of the timing adjuster 20. Since the signal sampled by the ADC 18 is inputted to the timing adjuster 20, the timing to carry out Fourier transform is adjustable in each sampling period of the ADC 18.

Figure 6:
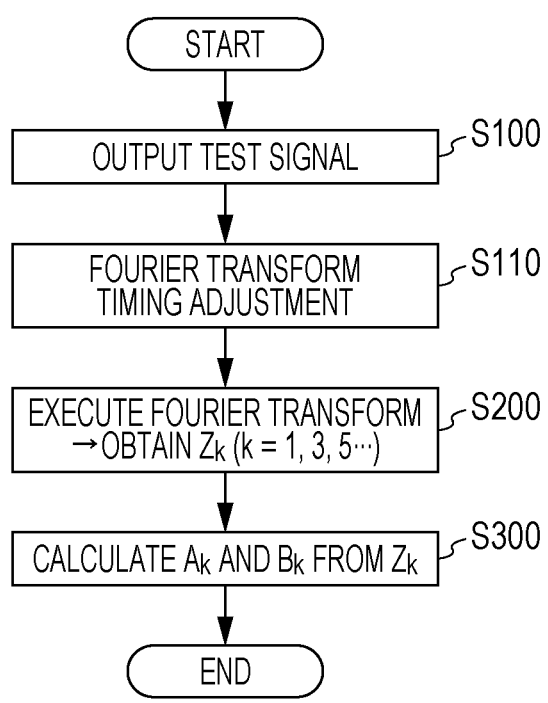
FIG. 6 is a diagram illustrating a flow chart that describes a process to obtain a distortion factor $A_k$ in the distortion compensation power amplifier according to Third Embodiment.

FIG. 6 is a flow chart that describes a process to obtain a distortion factor $A_k$ in the distortion compensation power amplifier 3 according to Third Embodiment. In FIG. 6, same reference characters are given to steps of behaviors same as the flow chart in FIG. 4 described above to omit the descriptions. In step S110, the timing adjuster 20 adjusts timing to carry out Fourier transform. Then, in step S200, the Fourier transformer 12 carries out Fourier transform based on the timing adjusted by the timing adjuster 20.

In such a manner, the distortion compensation power amplifier 3 according to Third Embodiment is provided with the timing adjuster 20 and appropriately adjusts timing to carry out Fourier transform, so that it is possible to accurately obtain the distortion factor $A_k$.

Fourth Embodiment

Figure 7:
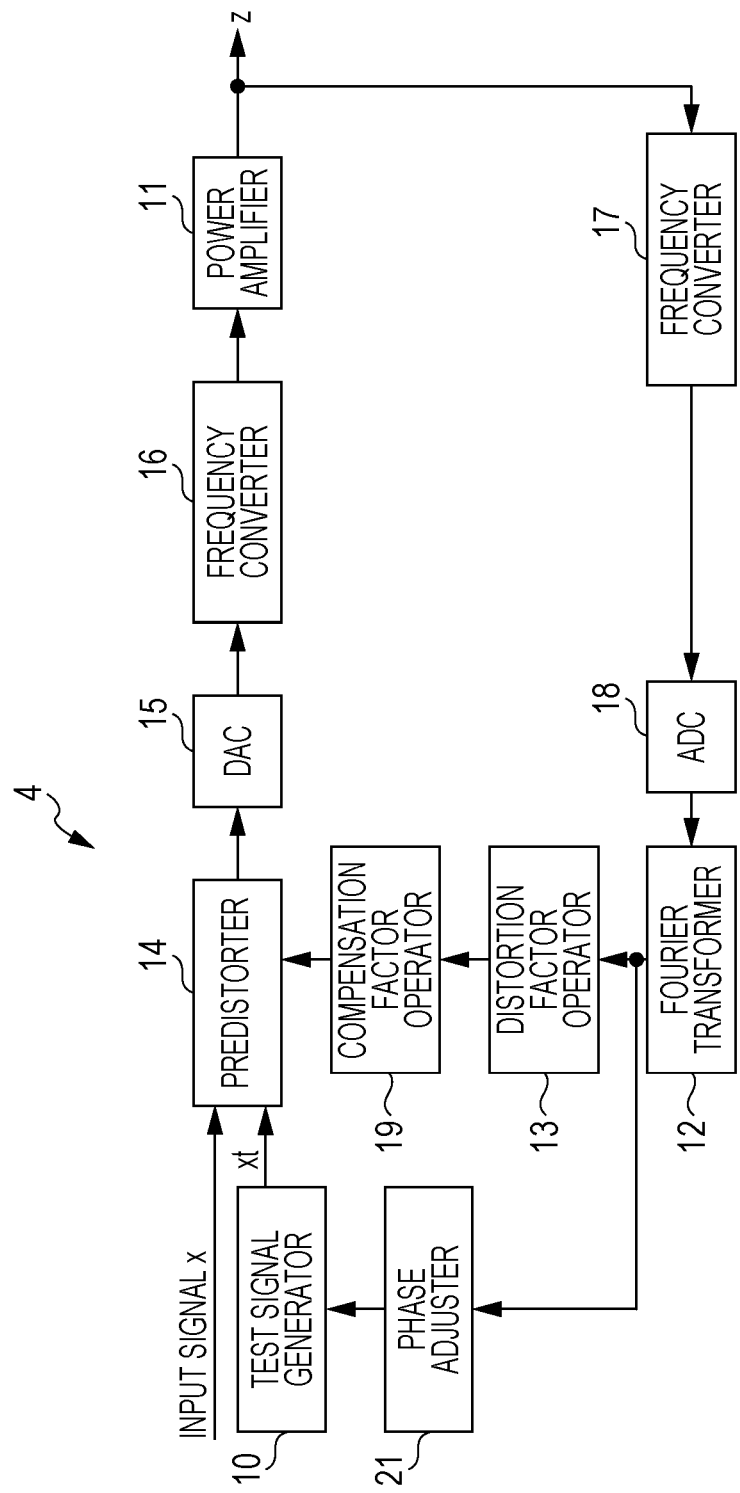
FIG. 7 is a block diagram illustrating a schematic configuration of a distortion compensation power amplifier according to Fourth Embodiment.

FIG. 7 is a block diagram illustrating a schematic configuration of a distortion compensation power amplifier according to Fourth Embodiment. In FIG. 7, identical reference characters are given to components in common with FIGS. 2 and 3 described above. A distortion compensation power amplifier 4 illustrated in FIG. 7 is capable of correctly obtaining a distortion factor $A_k$ even when there is a timing offset in the timing to carry outs Fourier transform similar to the distortion compensation power amplifier 3 according to Third Embodiment. In particular, a difference from the distortion compensation power amplifier 2 according to Second Embodiment illustrated in FIG. 3 is that a phase adjuster 21 is provided. By adjusting a phase of a test signal xt in the phase adjuster 21, the influence of a timing offset in the timing to carry out Fourier transform is cancelled.

Descriptions are given below to a behavioral principle of the phase adjuster 21. For simplification, Expression (10) is rewritten to be represented by Expression (13). Expression (13) represents a case where there is no timing offset in timing to carry out Fourier transform to.

$$z = Z_1(\cos\omega_1 t + \cos\omega_2 t) + Z_3\{\cos(2\omega_1 - \omega_2)t + \cos(2\omega_2 - \omega_1)t\} + \\ Z_5\{\cos(3\omega_1 - 2\omega_2)t + \cos(3\omega_2 - 2\omega_1)t\} \quad (13)$$

$$\vdots$$

When a timing offset $\Delta t$ occurs in the timing to carry out Fourier transform, z is represented by Expression (14).

$$z = Z_1\{\cos(\omega_1 t + \omega_1\Delta t) + \cos(\omega_2 t + \omega_2\Delta t)\} + \\ Z_3[\cos\{(2\omega_1 - \omega_2)t + (2\omega_1 - \omega_2)\Delta t\} + \\ \cos\{(2\omega_2 - \omega_1)t + (2\omega_2 - \omega_1)\Delta t\}] + \\ Z_5[\cos\{(3\omega_1 - 2\omega_2)t + (3\omega_1 - 2\omega_2)\Delta t\} + \\ \cos\{(3\omega_2 - 2\omega_1)t + (3\omega_2 - 2\omega_1)\Delta t\}] \quad (14)$$

$$\vdots$$

From Expression (14), it is found that different phase rotation occurs for each frequency component. For example, phase rotation of $\omega_1 \Delta t$ occurs with a $\omega_1$ component, and phase rotation of $(2\omega_1-\omega_2)\Delta t$ occurs with a $(2\omega_1-\omega_2)$ component. Here, in order to cancel the timing offset $\Delta t$, phase rotation is given to the original test signal. When the phase rotation given to the $\omega_1$ component is $\theta_1$ and the phase rotation given to the $\omega_2$ component is $\theta_2$, Expression (14) is represented as Expression (15).

$$z = Z_1\{\cos(\omega_1 t + \omega_1\Delta t + \theta_1) + \cos(\omega_2 t + \omega_2\Delta t + \theta_2)\} + \\ Z_3[\cos\{(2\omega_1 - \omega_2)t + (2\omega_1 - \omega_2)\Delta t + 2\theta_1 - \theta_2\} + \\ \cos\{(2\omega_2 - \omega_1)t + (2\omega_2 - \omega_1)\Delta t + 2\theta_2 - \theta_1\}] \\ Z_5[\cos\{(3\omega_1 - 2\omega_2)t + (3\omega_1 - 2\omega_2)\Delta t + 3\theta_1 - 2\theta_2\} + \\ \cos\{(3\omega_2 - 2\omega_1)t + (3\omega_2 - 2\omega_1)\Delta t + 3\theta_2 - 2\theta_1\}] \quad (15)$$

$$\vdots$$

From Expression (13), it is found that the $\omega_1$ component and the $\omega_2$ component are in a same phase when there is no timing offset. Utilizing this, the phase adjuster 21 detects the timing offset $\Delta t$ from a phase difference between the $\omega_1$ component and the $\omega_2$ component. When the phase difference between the $\omega_1$ component and the $\omega_2$ component is $\Delta\theta$, $\Delta\theta$ is represented by Expression (16). The phase of the $\omega_1$ component and the phase of the $\omega_2$ component are obtained from the Fourier transformer 12.

$$\Delta\theta = (\text{Phase of } \omega_1 \text{ component}) - (\text{Phase of } \omega_2 \text{ component}) \quad (16)$$

$$= \omega_1\Delta t - \omega_2\Delta t$$

$$= (\omega_1 - \omega_2)\Delta t$$

By deforming Expression (16), Expression (17) is obtained.

$$\Delta t = \frac{\Delta\theta}{\omega_1 - \omega_2} \quad (17)$$

Using the timing offset $\Delta t$ obtained by Expression (17), $\theta_1$ and $\theta_2$ are given in Expression (18).

$$\theta_1 = -\omega_1\Delta t = \frac{-\omega_1}{\omega_1 - \omega_2}\Delta\theta \quad (18)$$

$$\theta_2 = -\omega_2\Delta t = \frac{-\omega_2}{\omega_1 - \omega_2}\Delta\theta$$

It is found that Expression (13) is obtained by substituting Expression (18) into Expression (15). In other words, by giving the phase rotation obtained by Expression (18) to the test signal xt in the phase adjuster 21, it becomes possible to cancel the timing offset $\Delta t$ in the timing for Fourier transform. In the distortion compensation power amplifier 4 according to Fourth Embodiment, it is possible to adjust by giving arbitrary phase rotation without restricting adjustment accuracy by the sampling period of the ADC 18 as the distortion compensation power amplifier 3 according to Third Embodiment.

Figure 8:
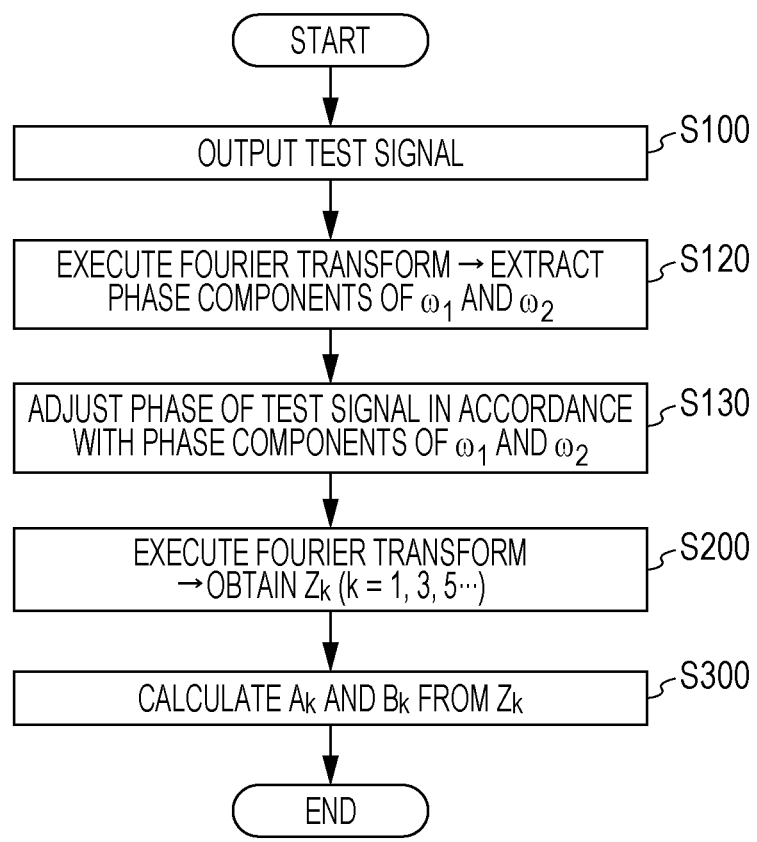
FIG. 8 is a diagram illustrating a flow chart that describes a process to obtain a distortion factor $A_k$ in the distortion compensation power amplifier according to Fourth Embodiment.

FIG. 8 is a flow chart that describes a process to obtain a distortion factor $A_k$ in the distortion compensation power amplifier 4 according to Fourth Embodiment. In FIG. 8, same reference characters are given to steps of behaviors same as the flow chart in FIG. 6 described above to omit the descriptions. In step S120, the Fourier transformer 12 carries out Fourier transform in timing determined in advance to obtain phase information of the $\omega_1$ component and phase information of the $\omega_2$ component. Subsequently, in step S130, the phase adjuster 21 adjusts the phase of the test signal xt in accordance with the phase information of the $\omega_2$ component and the phase information of the $\omega_2$ component.

Subsequently, in step S200, the Fourier transformer 12 carries out Fourier transform to obtain the Fourier coefficient $Z_k$.

In such a manner, with the distortion compensation power amplifier 4 according to Fourth Embodiment, a timing offset in timing for Fourier transform is cancelled by the phase adjuster 21, so that it is possible to obtain a distortion factor $A_k$ accurately.

Fifth Embodiment

Figure 9:
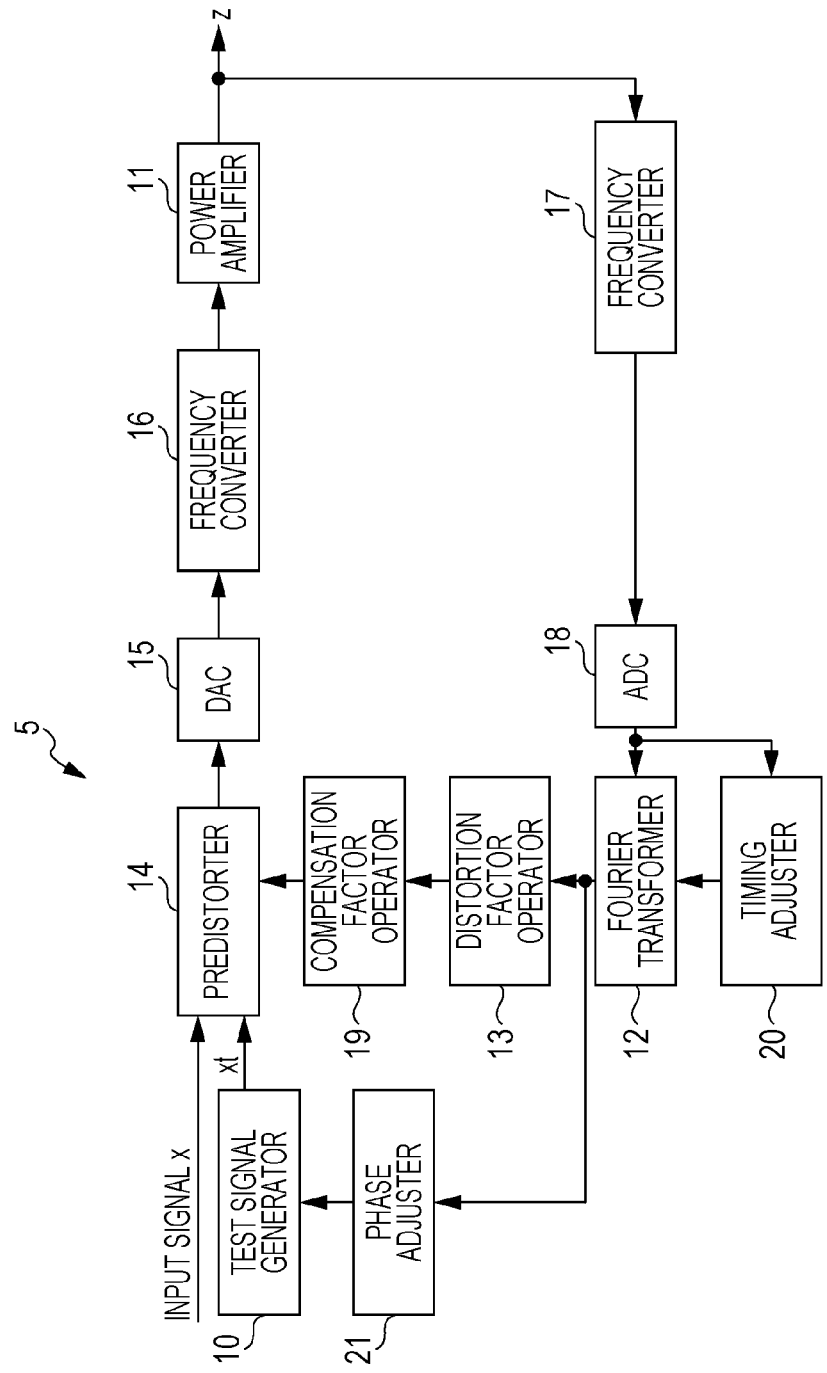
FIG. 9 is a block diagram illustrating a schematic configuration of a distortion compensation power amplifier according to Fifth Embodiment.

FIG. 9 is a block diagram illustrating a schematic configuration of a distortion compensation power amplifier according to Fifth Embodiment. A distortion compensation power amplifier 5 according to Fifth Embodiment illustrated in FIG. 9 is capable of correctly obtaining a distortion factor $A_k$ even when there is a timing offset in timing to carry out Fourier transform similar to the distortion compensation power amplifier 3 according to Third Embodiment and the distortion compensation power amplifier 4 according to Fourth Embodiment. The difference from the distortion compensation power amplifier 2 according to Second Embodiment illustrated in FIG. 3 is that a timing adjuster 20 and a phase adjuster 21 are provided. The timing adjuster 20 adjusts a timing offset in timing to carry out Fourier transform in each sampling period of an ADC 18. The phase adjuster 21 cancels timing offset less than the sampling period of the ADC 18 in the timing to carry out Fourier transform. In other words, the timing adjuster 20 carries out rough adjustment and the phase adjuster 21 carries out fine adjustment.

Figure 10:
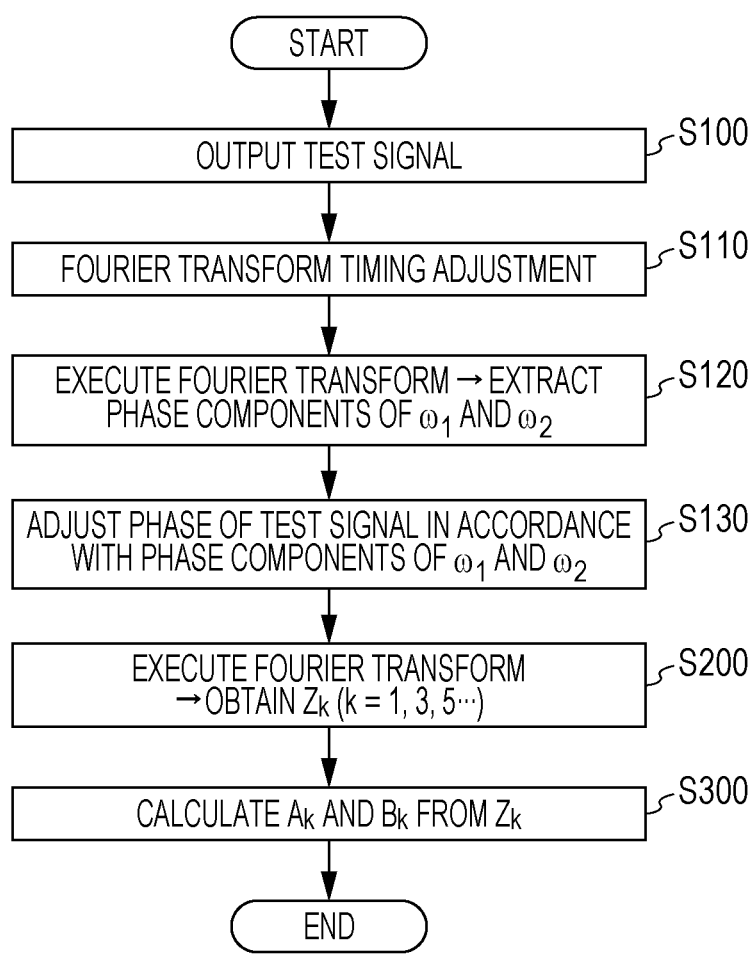
FIG. 10 is a diagram illustrating a flow chart that describes a process to obtain a distortion factor $A_k$ in the distortion compensation power amplifier according to Fifth Embodiment.

FIG. 10 is a flow chart that describes a process to obtain a distortion factor $A_k$ in the distortion compensation power amplifier 5 according to Fifth Embodiment. In FIG. 10, same reference characters are given to steps of behaviors same as the flow chart in FIG. 8 described above to omit the descriptions. In step S110, the timing adjuster 20 adjusts a timing offset in timing to carry out Fourier transform in each sampling period of the ADC 18. Then, in steps S120 and S130, by adjusting a phase of a test signal, the phase adjuster 21 adjusts a timing offset in timing to carry out Fourier transform with accuracy less than the sampling period of the ADC 18.

In such a manner, with the distortion compensation power amplifier 5 according to Fifth Embodiment, after carrying out timing adjustment in the sampling period of the ADC 18, the timing is finely adjusted with accuracy less than the sampling period of the ADC 18, so that it is possible to accurately adjust the timing to carry out Fourier transform.

Sixth Embodiment

Figure 11:
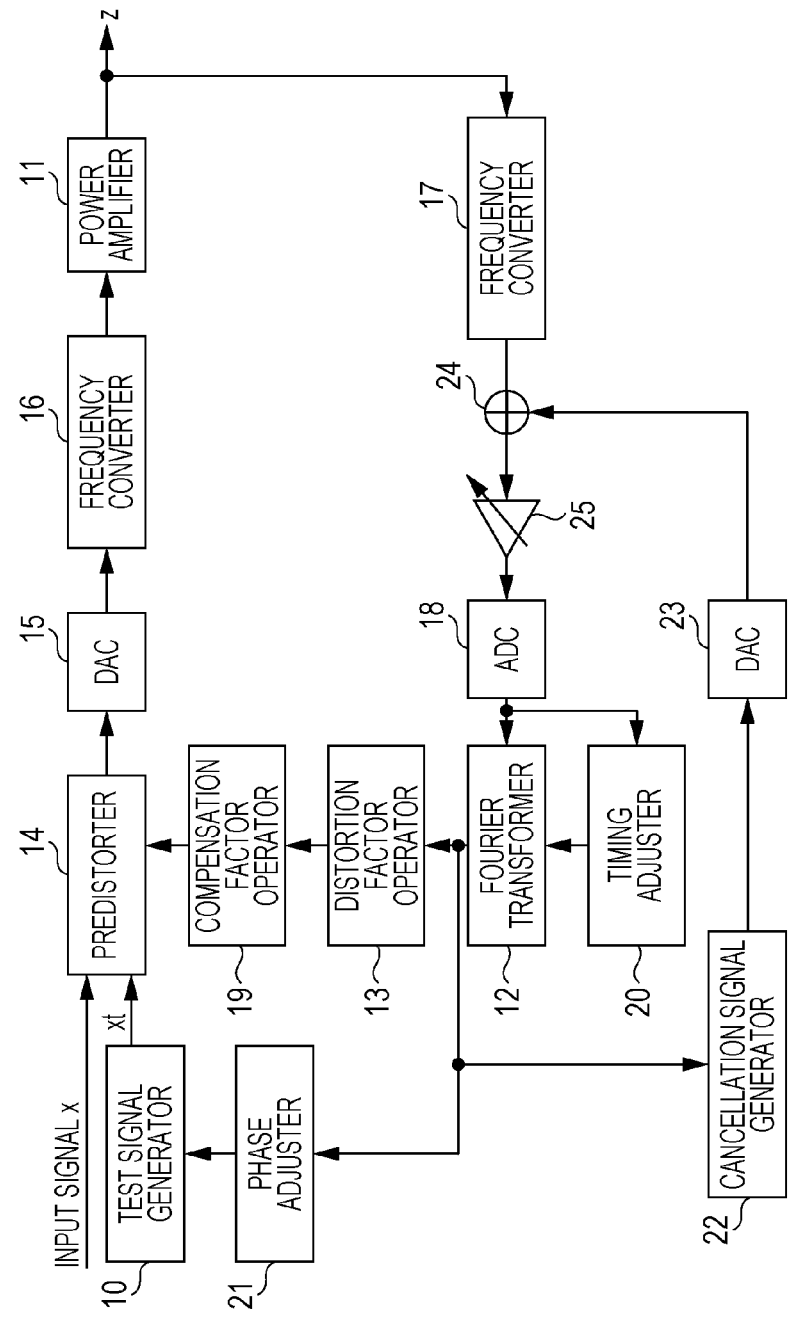
FIG. 11 is a block diagram illustrating a schematic configuration of a distortion compensation power amplifier according to Sixth Embodiment.

FIG. 11 is a block diagram illustrating a schematic configuration of a distortion compensation power amplifier according to Sixth Embodiment. A distortion compensation power amplifier 6 according to Sixth Embodiment illustrated in FIG. 11 is capable of accurately obtaining a distortion factor $A_k$ even when it is not possible to sufficiently secure a number of bits of the ADC 18. The difference from the distortion compensation power amplifier 5 according to Fifth Embodiment illustrated in FIG. 9 described above is that a cancellation signal generator 22, a DAC 23, an adder 24, and an amplitude adjuster 25 are provided. The cancellation signal generator 22 generates two-tone signal same as the test signal xt as a cancellation signal and also adjusts the amplitude, the phase, and the delay of the cancellation signal. The DAC 23 converts the cancellation signal to an analog signal. The adder 24 adds a signal outputted from the DAC 23 and a signal outputted from the frequency converter 17. The amplitude adjuster 25 adjusts the amplitude of the signal outputted from the adder 24 to fit in the input range of the ADC 18.

FIG. 12 is a flow chart that describes a process to obtain a distortion factor $A_k$ in the distortion compensation power amplifier 6 according to Sixth Embodiment. In FIG. 12, same reference characters are given to steps of behaviors same as the flow chart in FIG. 10 described above to omit the descriptions. Step S100 through step S200 are executed in a state where the cancellation signal generator 22 does not output anything. In step S200, the Fourier transformer 12 executes Fourier transform to obtain $Z_1$, which is a Fourier coefficient of the $\omega_1$ component and the $\omega_2$ component. Subsequently, in step S210, the cancellation signal generator 22 outputs a cancellation signal. Subsequently, in step S220, while observing an output of the Fourier transformer 12, the cancellation signal generator 22 adjusts the amplitude, the phase, and the delay of the cancellation signal in such a manner that a component, same as the frequency component included in the cancellation signal, of the signal inputted to the Fourier transformer 12 becomes small. Subsequently, in step S230, the amplitude adjuster 25 adjusts the gain in such a manner that the level of the signal inputted to the ADC 18 gets closer to the input range of the ADC. Subsequently, in step S240, the Fourier transformer 12 executes Fourier transform to obtain Fourier coefficients $Z_3$, $Z_5$, . . . . Subsequently, in step S300, the compensation factor calculator 19 obtains the distortion factor $A_k$ based onbased on the $Z_1$ obtained in step S200, $Z_3$, $Z_5$, . . . obtained in step S240, and the gain of the amplitude adjuster 25 to obtain a compensation factor $B_k$ from the distortion factor $A_k$ based on Expression (7). Here, when the distortion factor $A_k$ is obtained, the gain of the amplitude adjuster 25 to obtain the Fourier coefficient $Z_1$ is different from the gain of the amplitude adjuster 25 to obtain the Fourier coefficients $Z_3$, $Z_5$, . . . , so that the gain difference has to be corrected. When the gain of the amplitude adjuster 25 to obtain the Fourier coefficients $Z_3$, $Z_5$, . . . in step S240 relative to the gain of the amplitude adjuster 25 to obtain the Fourier coefficient $Z_1$ in step S200 is G, Expression (11) to obtain the distortion factor $A_k$ is rewritten as Expression (19). Since it is possible to correct the gain difference of the amplitude adjuster 25 to obtain the Fourier coefficient by solving Expression (19), it is possible to obtain the distortion factor $A_k$ correctly.

$$\begin{bmatrix} Z_1 \\ Z_3/G \\ Z_5/G \\ \vdots \end{bmatrix} = E \begin{bmatrix} A_1 \\ A_3 \\ A_5 \\ \vdots \end{bmatrix} \qquad (19)$$

Figure 13A:
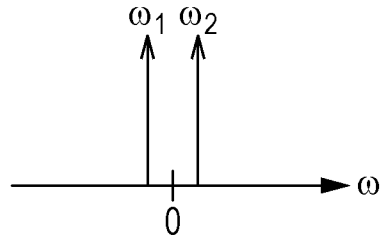
FIGS. 13A through 13E are diagrams that represent major signals in the distortion compensation power amplifier according to Sixth Embodiment.
Figure 13B:
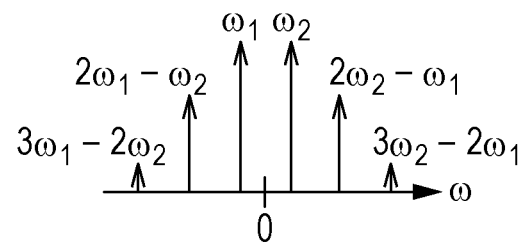
Figure 13C:
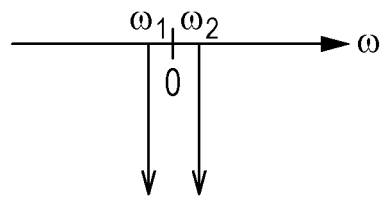

FIGS. 13A through 13E are diagrams that represent major signals in the distortion compensation power amplifier 6 according to Sixth Embodiment. FIG. 13A is a test signal outputted from the test signal generator 10. As the test signal, two-tone signal having frequency components of $\omega_1$ and $\omega_2$ are outputted. FIG. 13B is a signal outputted from the frequency converter 17. As an example, a case where frequency components of $2\omega_1-\omega_2$, $2\omega_2-\omega_1$, $3\omega_1-2\omega_2$, and $3\omega_2-2\omega_1$ are produced due to the nonlinear distortion in the power amplifier 11 is illustrated. FIG. 13C is a cancellation signal outputted from the cancellation signal generator 22. The cancellation signal illustrated in FIG. 13C is configured with the frequency components of $\omega_1$ and $\omega_2$ out of the frequency components of the signal outputted from the power amplifier 11. The amplitude, the phase, and the delay are adjusted in such a manner that it is possible to suppress frequency components same as the cancellation signal out of the frequency components of the signal outputted from the power amplifier 11.

Figure 13D:
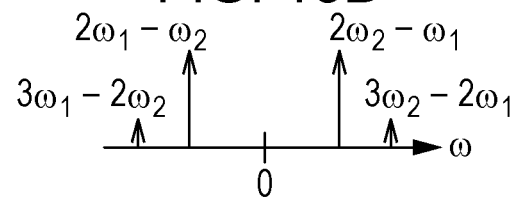
Figure 13E:
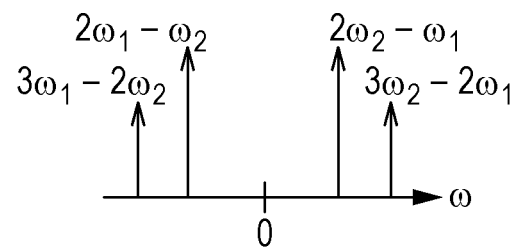

FIG. 13D is a signal outputted from the adder 24. In FIG. 13D, as a result of adding the signal in FIG. 13B and the signal in FIG. 13C, the frequency components of $\omega_1$ and $\omega_2$ are suppressed. FIG. 13E is a signal outputted from the amplitude adjuster 25. In FIG. 13E, the signal in FIG. 13D is amplified to the input range of the ADC 18. In FIG. 13E, since the frequency components of $\omega_1$ and $\omega_2$ are suppressed, the frequency components of $2\omega_1$-$\omega_2$, $2\omega_2$-$\omega_1$, $3\omega_1$-$2\omega_2$, and $3\omega_2$-$2\omega_1$ are amplified with no distortion and it is possible to obtain the distortion factor without affected by a quantization error of the ADC.

In such a manner, with the distortion compensation power amplifier 6 according to Sixth Embodiment, after suppressing frequency components having high signal levels out of the signal outputted from the power amplifier 11, the signal is amplified to the input range of the ADC 18 and then the distortion factor $A_k$ is obtained, so that it is possible to accurately obtain the distortion factor $A_k$ even when it is not possible to sufficiently secure the number of bits of the ADC.

Although a case where two-tone signal are used for a test signal is described in First through Sixth Embodiments described above as examples, three or more tone signals may also be used.

In addition, although the descriptions are given that Fourier transform is carried out as a behavior of the Fourier transformer 12 in First through Sixth Embodiments described above, fast Fourier transform (FFT) may also be carried out. Alternatively, it may also be a plurality of band pass filters. It may be as long as it is possible to extract a specific frequency component as a principle.

In Third and Fifth Embodiments described above, a period to observe the amplitude value of the signal in the timing adjuster 20 may be one period of the test signal and may also be two or more periods. By observing in two or more periods to detect a maximum value a plurality of times, it is possible to reduce the influence of disturbance, such as a noise, and it is possible to accurately determine timing for Fourier transform.

In addition, although the descriptions are given that the timing adjuster 20 detects the timing when the amplitude value of the signal inputted to the Fourier transformer 12 becomes maximum in Third and Fifth Embodiments described above, it may be other methods as long as it is possible to detect timing to be a reference of the test signal, which is a periodic function, and timing to have a minimum amplitude value may also be detected. In addition, timing to have a maximum absolute value of the amplitude value or timing to have a minimum absolute value of the amplitude value may also be detected. Further, when the signal outputted from the ADC 18 is complex signals of I and Q, an absolute value of the complex signal or timing to have a maximum or minimum power value may also be detected.

In First through Sixth Embodiments described above, the operation of Expression (2) in the predistorter 14 may also be achieved as a look-up table (LUT) to have an output signal y relative to an input signal x.

Figure 14A:
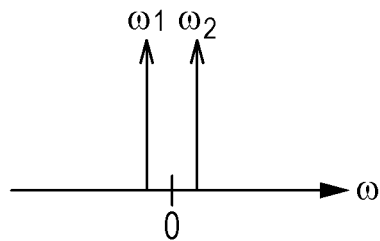
FIGS. 14A through 14E are diagrams that represent major signals in the distortion compensation power amplifier according to Sixth Embodiment.
Figure 14B:
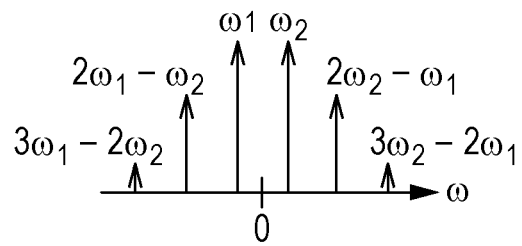
Figure 14C:
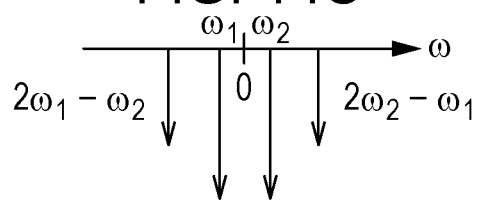

In Sixth Embodiment described above, although the descriptions are given to a case where the cancellation signal is two-tone signal as an example, tone signals of a greater number may also be used. Here, using FIGS. 14A through 14E, a case of using four-tone signal as a cancellation signal is described. FIGS. 14A and 14B are same as FIGS. 13A and 13B, respectively. FIG. 14C is a cancellation signal outputted from the cancellation signal generator 22. The cancellation signal illustrated in FIG. 14C is configured with frequency components of $\omega_1$, $\omega_2$, $2\omega_1$-$\omega_1$, and $2\omega_2$-$\omega_1$ out of the frequency components of the signal outputted from the power amplifier 11. The amplitude, the phase, and the delay are adjusted in such a manner that it is possible to suppress the frequency components same as the cancellation signal out of the frequency components of the signal outputted from the power amplifier 11.

Figure 14D:
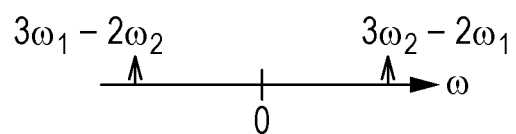
Figure 14E:
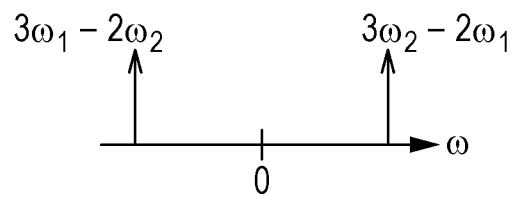

FIG. 14D is a signal outputted from the adder 24. In FIG. 14D, as a result of adding the signal in FIG. 14B and the signal in FIG. 14C, frequency components of $\omega_1$, $\omega_2$, $2\omega_1$-$\omega_2$, and $2\omega_2$-$\omega_1$ are suppressed. FIG. 14E is a signal outputted from the amplitude adjuster 25. In FIG. 14E, the signal in FIG. 14D is amplified to the input range of the ADC 18. In FIG. 14E, the frequency components of $\omega_1$, $\omega_2$, $2\omega_1$-$\omega_2$, and $2\omega_2$-$\omega_1$ are suppressed, so that frequency components of $3\omega_1$-$2\omega_2$ and $3\omega_2$-$2\omega_1$ are amplified with no distortion and it is possible to obtain a distortion factor without affected by a quantization error of the ADC 18.

Modification of Sixth Embodiment

FIG. 15 is a flow chart that describes a process to obtain a distortion factor $A_k$ in a modification of the distortion compensation power amplifier 6 according to Sixth Embodiment. In the modification of the distortion compensation power amplifier 6 according to Sixth Embodiment, the two-tone cancellation signal illustrated in FIG. 13C and the four-tone cancellation signal illustrated in FIG. 14C are used. In FIG. 15, same reference characters are given to steps of behaviors same as the flow chart in FIG. 12 described above to omit the descriptions. Steps S100 through S230 are same as the flow chart in FIG. 12. It should be noted that the Fourier coefficient $Z_1$ obtained in step S200 corresponds to a first Fourier coefficient. In step S230, the amplitude adjuster 25 outputs the signal illustrated in FIG. 13E. Subsequently, in step S250, the Fourier transformer 12 carries out Fourier transform to obtain $Z_3$ (corresponding to second Fourier coefficient), which is a Fourier coefficient of the component of $2\omega_1$-$\omega_2$ and $2\omega_2$-$\omega_1$. Subsequently, in step S260, the cancellation signal generator 22 outputs the four-tone cancellation signal illustrated in FIG. 14C. Subsequently, in step S270, while observing an output of the Fourier transformer 12, the cancellation signal generator 22 adjusts the amplitude, the phase, and the delay of the cancellation signal in such a manner that a component, same as the frequency component included in the cancellation signal, of the signal inputted to the Fourier transformer 12 becomes small.

Subsequently, in step S280, the amplitude adjuster 25 adjusts the gain in such a manner that the level of the signal inputted to the ADC 18 gets closer to the input range of the ADC. At this time, the signal outputted from the amplitude adjuster 25 is as FIG. 14E. Subsequently, in step S290, the Fourier transformer 12 executes Fourier transform to obtain Fourier coefficients $Z_5$, $Z_7$, . . . (third Fourier coefficient and later). Subsequently, in step S300, the distortion factor calculator 13 obtains a distortion factor $A_k$ based on based on $Z_1$ obtained in step S200, $Z_3$ obtained in step S250, $Z_5$, $Z_7$, . . . obtained in step S290, and the gain of the amplitude adjuster 25. Then, the compensation factor calculator 19 obtains a compensation factor $B_k$ from the distortion factor $A_k$ based on Expression (7). Here, $G_2$ is the gain of the amplitude adjuster 25 to obtain the Fourier coefficient $Z_3$ in step S250 relative to the gain of the amplitude adjuster 25 to obtain the Fourier coefficient $Z_1$ in step S200. In addition, $G_3$ is the gain of the amplitude adjuster 25 to obtain the Fourier coefficients $Z_5$, $Z_7$, . . . in step S290 relative to the gain of the amplitude adjuster 25 to obtain the Fourier coefficient $Z_1$ in step S200. Using $G_2$ and $G_3$, Expression (11) to obtain the distortion factor $A_k$ is rewritten as Expression (20). It is possible to correct the gain difference of the amplitude adjuster 25 to obtain the Fourier coefficient by solving Expression (20), so that it is possible to obtain the distortion factor $A_k$ correctly.

$$\begin{bmatrix} Z_1 \\ Z_3/G_2 \\ Z_5/G_3 \\ \vdots \end{bmatrix} = E \begin{bmatrix} A_1 \\ A_3 \\ A_5 \\ \vdots \end{bmatrix} \quad (20)$$

In the flow chart in FIG. 12, after obtaining the Fourier coefficient $Z_1$ firstly, the cancellation signal is outputted to obtain the Fourier coefficients $Z_3$, $Z_5$, . . . , whereas in the flow chart in FIG. 15, after obtaining the Fourier coefficient $Z_1$ firstly, a two-tone cancellation signal is outputted to obtain the Fourier coefficient $Z_3$ and after that a four-tone cancellation signal is further outputted to obtain the Fourier coefficients $Z_5$, $Z_7$, . . . . In such a manner, by obtaining the Fourier coefficients stepwise, it is possible to reduce the influence of the quantization error of the ADC 18 and accurately obtain the distortion factor $A_k$.

Outline of Aspect of Present Disclosure

A first nonlinear distortion detection device of the present disclosure is a nonlinear distortion detection device that includes a test signal generator that generates a test signal and outputs the test signal to have the power amplifier amplify the test signal, a Fourier transformer that converts the amplified test signal to a signal in a frequency domain, and a distortion factor calculator that calculates a distortion factor of the power amplifier based on amplitude information and phase information of the signal in the frequency domain.

A second nonlinear distortion detection device of the present disclosure is the first nonlinear distortion detection device, wherein the test signal is a two-tone signal.

A third nonlinear distortion detection device of the present disclosure is the first or second nonlinear distortion detection device, further including a timing adjuster that adjusts timing in which the Fourier transformer converts the amplified test signal to the signal in the frequency domain, wherein the timing adjuster adjusts timing for the conversion based on an amplitude value of the amplified test signal that is inputted to the Fourier transformer.

A fourth nonlinear distortion detection device of the present disclosure is any one of the first through third nonlinear distortion detection devices, further including a phase adjuster that adjusts a phase of the test signal, wherein the phase adjuster gives phase rotation to the test signal based on the phase information.

A fifth nonlinear distortion detection device of the present disclosure is any one of the first through fourth nonlinear distortion detection devices, further including a cancellation signal generator that generates a cancellation signal and adjusts an amplitude, a phase, and a delay of the cancellation signal, an adder that adds the adjusted cancellation signal and the amplified test signal output from the power ampli- fier, an amplitude adjuster that adjusts an amplitude of an output signal of the adder, and an ADC that converts the amplitude adjusted signal output from the amplitude adjuster to a digital signal, wherein the Fourier transformer converts the digital signal output from the ADC to a signal in the frequency domain, and the distortion factor calculator obtains the amplitude information and the phase information as first amplitude and phase information when the cancellation signal is not added with the amplified test signal output from the power amplifier and obtains the amplitude information and the phase information as second amplitude and phase information when the cancellation signal is added with the amplified test signal output from the power amplifier to calculate a distortion factor based on the first amplitude and phase information and the second amplitude and phase information.

A sixth nonlinear distortion detection device of the present disclosure is the fifth nonlinear distortion detection device, wherein the cancellation signal is a two-tone signal.

A seventh nonlinear distortion detection device of the present disclosure is the fifth nonlinear distortion detection device, wherein the cancellation signal is a four-tone signal.

An eighth nonlinear distortion detection device of the present disclosure is the fifth nonlinear distortion detection device, wherein the cancellation signal is a two-tone signal and a four-tone signal, and, after a first Fourier coefficient is obtained, the cancellation signal of the two-tone signal is outputted from the cancellation signal generator and the Fourier transformer obtains a second Fourier coefficient, and then, the cancellation signal of the four-tone signal is further outputted from the cancellation signal generator and the Fourier transformer obtains a third Fourier coefficient and later Fourier coefficient.

A distortion compensation power amplifier of the present disclosure is a distortion compensation power amplifier that performs predistortion of a power amplifier. The distortion compensation power amplifier includes a test signal generator that generates a test signal, a power amplifier that amplifies the generated test signal and outputs the amplified test signal, a Fourier transformer that converts the amplified test signal to a signal in a frequency domain, a distortion factor calculator that calculates a distortion factor of the power amplifier based on amplitude information and phase information of the signal in the frequency domain, a compensation factor calculator that calculates a compensation factor to perform predistortion based on the distortion factor, and a predistorter that performs predistortion of an input signal using the compensation factor, wherein the test signal is inputted to the power amplifier when the distortion compensation power amplifier calculates the distortion factor, and a signal predistorted using the compensation factor is inputted to the power amplifier when the distortion compensation power amplifier amplifies the input signal.

Although the descriptions have been given above to various embodiments with reference to the drawings, the present disclosure is not limited to such examples, of course. It is obvious that those skilled in the art may conceive of various modifications and alterations within the scope of the appended claims and it is naturally understood that they belong to the technical scope of the present disclosure.

It is possible to apply the present disclosure to various wireless communication devices, such as wireless LAN, ZigBee®, and Bluetooth®. Particularly, it is useful for wireless communication devices having an FFT circuit, such as wireless communication devices using an orthogonal frequency division multiplex (OFDM) approach for the modulation/demodulation system and wireless communication devices using a frequency domain equalizer (FDE) approach for the equalizer, for example.

What is claimed is:

1. A nonlinear distortion detection device comprising:
a test signal generator that generates a test signal and outputs the test signal to have a power amplifier amplify the test signal, the test signal being a two-tone signal acquired by adding a first cosine wave signal and a second cosine wave signal, which share a same amplitude and have different frequencies from each other;
an analog-to-digital converter (ADC) that converts an analog signal output from the power amplifier to a digital signal;
a timing adjuster that
receives the digital signal from the ADC,
detects a timing at which an amplitude value of the digital signal becomes largest, and
outputs a timing signal that indicates the detected timing;
a Fourier transformer that
receives the digital signal from the ADC,
receives the timing signal from the timing adjuster, and
converts the digital signal to a signal in a frequency domain at the detected timing indicated by the received timing signal,
a distortion factor calculator that calculates a distortion factor of the power amplifier based on amplitude information and phase information of the signal in the frequency domain,
wherein the calculated distortion factor is used to compensate distortion caused by the power amplifier.

2. The nonlinear distortion detection device according to claim 1, further comprising:
a phase adjuster that adjusts a phase of the test signal, wherein the phase adjuster gives phase rotation to the test signal based on the phase information.

3. The nonlinear distortion detection device according to claim 1, further comprising:
a cancellation signal generator that generates a cancellation signal and adjusts an amplitude, a phase, and a delay of the cancellation signal;
an adder that adds the adjusted cancellation signal and the amplified test signal output from the power amplifier to output an added signal; and
an amplitude adjuster that adjusts an amplitude of the added signal output from the adder;
wherein
the distortion factor calculator
obtains the amplitude information and the phase information as first amplitude and first phase information when the cancellation signal is not added with the amplified test signal output from the power amplifier,
obtains the amplitude information and the phase information as second amplitude and second phase information when the cancellation signal is added with the amplified test signal output from the power amplifier, and
calculates a distortion factor based on the first amplitude and first phase information and the second amplitude and second phase information.

4. The nonlinear distortion detection device according to claim 3, wherein
the cancellation signal is a two-tone signal, the two-tone signal being a signal acquired by adding two cosine wave signals which share a same amplitude and have different frequencies from each other.

5. The nonlinear distortion detection device according to claim 3, wherein
the cancellation signal is a four-tone signal, the four-tone signal being a signal acquired by adding four cosine wave signals which share a same amplitude and have different frequencies from each other.

6. The nonlinear distortion detection device according to claim 3, wherein
the cancellation signal includes a two-tone signal and a four-tone signal, the two-tone signal being a signal acquired by adding two cosine wave signals which share a same amplitude and have different frequencies from each other, and the four-tone signal being another signal acquired by adding four cosine wave signals which share a same amplitude and have different frequencies from each other, and,
after a first Fourier coefficient is obtained, the cancellation signal of the two-tone signal is outputted from the cancellation signal generator and the Fourier transformer obtains a second Fourier coefficient, and then, the cancellation signal of the four-tone signal is further outputted from the cancellation signal generator and the Fourier transformer obtains a third Fourier coefficient and a fourth Fourier coefficient.

7. The nonlinear distortion detection device according to claim 1, wherein the digital signal received by the timing adjuster is directly received from the ADC.

8. A distortion compensation power amplifier comprising:
a test signal generator that generates a test signal, the test signal being a two-tone signal acquired by adding a first cosine wave signal and a second cosine wave signal which share a same amplitude and have different frequency from each other;
a power amplifier that amplifies the generated test signal and outputs the amplified test signal;
an analog-to-digital converter (ADC) that converts an analog signal output from the power amplifier to a digital signal;
a timing adjuster that
receives the digital signal from the ADC,
detects a timing at which an amplitude value of the digital signal becomes largest, and
outputs a timing signal that indicates the detected timing;
a Fourier transformer that
receives the digital signal from the ADC,
receives the timing signal from the timing adjuster, and
converts the digital signal to a signal in a frequency domain at the detected timing indicated by the received timing signal,
a distortion factor calculator that calculates a distortion factor of the power amplifier based on amplitude information and phase information of the signal in the frequency domain, wherein the calculated distortion factor is used to compensate distortion caused by the power amplifier;
a compensation factor calculator that calculates a compensation factor to perform compensation based on the distortion factor; and
a predistorter that performs compensation of an input signal using the compensation factor, wherein
the test signal is inputted to the power amplifier when the distortion compensation power amplifier calculates the distortion factor, and the signal predistorted using the compensation factor is inputted to the power amplifier when the distortion compensation power amplifier amplifies the input signal.

* * * * *